US012790198B2

(12) United States Patent
Dürr

(10) Patent No.: US 12,790,198 B2
(45) Date of Patent: Nov. 10, 2026

(54) MEMS ACTUATOR AND MEMS ACTUATOR ARRAY WITH A PLURALITY OF MEMS ACTUATORS

(71) Applicant: Fraunhofer-Gesellschaft zur Förderung der angewandten Forschung e.V., Munich (DE)

(72) Inventor: Peter Dürr, Dresden (DE)

(73) Assignee: FRAUNHOFER-GESELLSCHAFT ZUR FORDERUNG DER ANGEWANDTEN FORSCHUNG E.V., Munich (DE)

( * ) Notice: Subject to any disclaimer, the term of this patent is extended or adjusted under 35 U.S.C. 154(b) by 1175 days.

(21) Appl. No.: 17/568,927

(22) Filed: Jan. 5, 2022

(65) Prior Publication Data

US 2022/0127136 A1 Apr. 28, 2022

Related U.S. Application Data

(63) Continuation of application No. PCT/EP2020/069102, filed on Jul. 7, 2020.

(30) Foreign Application Priority Data

Jul. 8, 2019 (DE) ..................... 10 2019 210 026.0

(51) Int. Cl.
*B81B 3/00* (2006.01)
*G02B 26/08* (2006.01)

(52) U.S. Cl.
CPC ...... *B81B 3/0037* (2013.01); *B81B 2201/033* (2013.01); *B81B 2201/042* (2013.01); (Continued)

(58) Field of Classification Search
CPC ...... B81B 2203/053; B81B 2203/0136; B81B 2201/033
See application file for complete search history.

(56) References Cited

U.S. PATENT DOCUMENTS 5,969,848 A 10/1999 Lee et al.
6,384,952 B1 5/2002 Clark et al.
(Continued)

FOREIGN PATENT DOCUMENTS

DE 10 2015 200 626 B3 7/2016
DE 10 2018 207 783 A1 11/2019
(Continued)

OTHER PUBLICATIONS

Hane et al., Micro-Mirrors (Year: 2008).*
(Continued)

*Primary Examiner* — Norman D Richards
(74) *Attorney, Agent, or Firm* — McClure, Qualey & Rodack, LLP

(57) ABSTRACT

A MEMS (micro-electromechanical system) actuator includes a substrate, a first electrode structure that is stationary with respect to the substrate, wherein the first electrode structure comprises a plurality of partial electrode structures, each of which comprises an edge structure and can be electrically controlled separately and a second electrode structure with an edge structure, wherein the second electrode structure is deflectably coupled to the substrate by means of a spring structure and electronically deflectable by means of the first electrode structure to move the edge structure of the second electrode structure into a discrete deflection position, wherein the edge structures of the first and second electrode structures are configured to be opposite to each other with respect to a top view and the opposite portions are spaced apart by a lateral distance.

21 Claims, 6 Drawing Sheets

(52) U.S. Cl.
CPC ... *B81B 2203/0136* (2013.01); *B81B 2203/04* (2013.01); *B81B 2207/012* (2013.01); *G02B 26/0841* (2013.01)

(56) References Cited

U.S. PATENT DOCUMENTS

| | | | | |
|---|---|---|---|---|
| 6,900,922 | B2 | 5/2005 | Aubuchon | |
| 7,295,726 | B1 * | 11/2007 | Milanovic | G02B 26/0841 385/16 |
| 7,929,192 | B2 | 4/2011 | Sandner | |
| 10,807,859 | B2 | 10/2020 | Duerr et al. | |
| 2004/0165250 | A1 | 8/2004 | Aubuchon | |
| 2008/0239429 | A1 | 10/2008 | Sandner | |
| 2009/0268270 | A1 * | 10/2009 | Keyworth | B81B 3/0062 359/226.1 |
| 2014/0362460 | A1 * | 12/2014 | Nozu | H02N 1/008 359/849 |
| 2016/0332872 | A1 * | 11/2016 | Iihola | G01C 19/5769 |
| 2017/0297897 | A1 | 10/2017 | Duerr et al. | |
| 2017/0363424 | A1 * | 12/2017 | Maspero | G01C 19/5762 |
| 2021/0061642 | A1 | 3/2021 | Duerr et al. | |

FOREIGN PATENT DOCUMENTS

| | | | | |
|---|---|---|---|---|
| EP | 3 257 808 A1 | | 12/2017 | |
| WO | WO-2016020716 A1 | * | 2/2016 | B25J 7/00 |

OTHER PUBLICATIONS

Wang et al., 2D broadband beamsteering with large-scale MEMS optical phased array (Year: 2019).*
Bartlett et al., Adapting Texas Instruments DLP technology to demonstrate a phase spatial light modulator (Year: 2019).*
International Search Report and Written Opinion issued in application No. PCT/EP2020/069102.
Gehner, A., et al.; "Micromirror arrays for wavefront correction;" SPIE; vol. 4178; Sep. 2000; pp. 348-357.
Lakner, H., et al.; "Design and Fabrication of Micromirror Arrays for UV-Lithography;" Proc of SPIE; vol. 4561; 2001; pp. 1-10.
Bartlett, T., et al.; "Adapting Texas Instruments DLP technology to demonstrate a phase spatial light modulator;" Emerging Digital Micromirror Device Based Systems and Applications XI; Proceedings of SPIE; vol. 10932; Feb. 2019; pp. 1-14.
Texas Instruments Incorporated; "DMD 101—Introduction to DMD technology;" Mar. 2009; pp. 1-15.
Durr, P., et al.; "Micro-actuator with extended analog deflection at low drive voltage;" Proceedings of SPIE; vol. 6114; 2006; pp. 1-10.
Schenk, H., et al.; "A Novel Electrostatically Driven Torsional Actuator," Proc. 3rd Int. Conf. on Micro Opto Electro Mechanical Systems; Aug./Sep. 1999; pp. 1-8.
Gu, H., et al.; "Pseudo-analog electrostatic piston micromirror;" MEMS Adaptive Optics IV.; vol. 7595;; International Society for Optics and Photonics; 2010; pp. 1-7.
Bifano, T., et al.; "Large-scale metal MEMS mirror arrays with integrated electronics;" Proc. of SPIE; vol. 4755; 2002; pp. 467-476.
Milanovic, V., et al.; "High Aspect Ratio Micromirrors With Large Static Rotation and Piston Actuation;" IEEE Photonics Technology Letters; vol. 16; No. 8; Aug. 2004; pp. 1891-1893.

* cited by examiner

MEMS ACTUATOR AND MEMS ACTUATOR ARRAY WITH A PLURALITY OF MEMS ACTUATORS

CROSS-REFERENCE TO RELATED APPLICATIONS

This application is a continuation of copending International Application No. PCT/EP2020/069102, filed Jul. 7, 2020, which is incorporated herein by reference in its entirety, and additionally claims priority from German Application No. 10 2019 210 026.0, filed Jul. 8, 2019, which is incorporated herein by reference in their entirety.

The present invention relates to a MEMS actuator (MEMS=micro-electromechanical system) and its structure and further to a MEMS actuator array having a plurality of MEMS actuators. Further, embodiments relate to a MEMS actuator with digital control and evenly graduated deflection. Further, embodiments relate to a MEMS actuator having a comb drive with several electrically separate stationary electrode structures per MEMS actuator.

MEMS actuators according to embodiments can be used for a wide range of applications, such as scanner mirrors, optical switches for coupling optical fibers (optical cross-connect), microvalves, electric microswitches and other applications. A further relevant application are spatial light modulators where the MEMS actuators, which are frequently arranged, for example, as two-dimensional array, move micromirrors connected therewith and position the same as desired.

BACKGROUND OF THE INVENTION

In the following, the technical background will be discussed, wherein respective findings and technical conclusions of the inventors regarding the technical background are summarized, e.g., with reference to the cited references.

Mostly, the position of a moveable actuator element is controlled by an applied electric signal. In many cases, the electrostatic attractive force is used as physical effect, wherein also electromagnetic forces as well as piezoelectric or thermal expansion can be used.

Based on the type of motion that is to be executed, a distinction is made between rotating/tilting actuators and translatory actuators, as well as actuator types that enable both types of motion. In the latter case, the motion components can either be firmly coupled by the type of suspension, or individually adjusted by several control signals (e.g. piston-tip-tilt). The present inventive concept can be used for all these types of motion. However, to simplify the description, mainly translatory actuators will be discussed, especially those coupled with micromirrors for phase adjustment of light reflected thereon.

Often such actuators are densely packed in large numbers on a carrier substrate in a plane and the desired direction of deflection is translatory perpendicular to this plane or tilting about an axis lying in this plane. When micromirrors are coupled to each of the actuators, this is also referred to as a micromirror array. The shape and size of the micromirrors and the needed deflection are mostly determined by the application and optical boundary conditions. A great number of mirrors (up to several million) are often advantageous. To keep the size of the whole array within limits, the individual mirrors should become as small as possible. However, their size also limits the available space for the underlying memory cells of the electronic control as well as for the structural design of the actuator and thus the possible driving force. The dense packing also favors crosstalk, so that an actuator can also react in an unfavorable manner to the control signal of the adjacent actuators.

In the plate actuators discussed so far, the electric field is homogeneous to a useful approximation and the movable actuator element can be largely deflected in the field direction. Alternatively, there are actuators that are often referred to as comb drives.

These, on the other hand, are characterized by the fact that inhomogeneous boundary fields play the decisive role and the movable part can be deflected largely transversely to the direction of the strongest part of the electric field.

In the electrostatically controlled analog micromirror arrays known so far having a high to very high number of pixels (about >>1000 up to several million), plate actuators are usually used [1, 2]. These are relatively simple in design and production and can provide sufficient solutions.

The present inventive concept is suitable for micromechanical actuators that are electrostatically controlled and have a restoring elastic suspension that applies a corresponding counterforce for a static balance deflection. The deflection can thus be adjusted as desired within a given range and is not limited by mechanical stops.

Such actuators are usually controlled with an analog voltage between one (or two) stationary electrodes and the movable actuator element, see e.g. [1, 2]. However, there is also the possibility of digital control. For this, several electrodes are provided, each of which is then selectively supplied with one of only two possible address voltages.

For digital control, the electrodes are usually designed to have a varying influence on the deflection, e.g., as in [3, 4]. This can be effected by the different size of the electrodes or by their different lever arm to a tilting axis of the actuator, or also by a different effective distance of the electrodes from the movable actuator plate. Thus, such 'multistage digital actuators' have, in contrast to the widely used binary actuators (e.g. DMD/DLP from Texas Instruments [5]), more than two digitally controllable deflection positions that are not defined by mechanical stops but by a balance of electrostatic forces and spring forces.

However, plate actuators exhibit the known pull-in effect that, for parallel plates, renders all positions above a deflection of one third of the initial plate spacing with 0V applied voltage unstable and thus unusable [1]. In fact, the deflection characteristic curve is already so steep in the vicinity of the pull-in that in practice only a much smaller range of the initial distance can be used, about only 20%, possibly 25%. For example, if deflection of at least 320 nm (for 27 modulation range) is needed for phase modulation of visible light, this results in an initial distance of at least 1.3 μm, better 1.6 μm. This large distance results in quite small electrostatic forces (since the force decreases proportionally to the reciprocal of the square of the distance) and, for pixel sizes around or below 10 μm, also hardly controllable direct crosstalk between the electrodes of one pixel as well as the adjacent pixel.

Electrostatic comb drives have so far been mostly used in microsystems with single or few, larger actuators (with micromirrors or other movable components such as the mass in inertial sensors), e.g. [7, 8, 9]. The bulk micromechanical manufacturing methods commonly used in this context usually have structure sizes (e.g., finger widths) of several micrometers and are not well suited for pixels that should be only a few micrometers in size.

Comb drives can be configured for actuator deflection parallel to the electrode planes or fingers, or alternatively essentially perpendicular thereto. The latter is often referred to as vertical comb drive because the electrode planes are usually manufacturing planes parallel to a surface of a substrate. In this case, the upward and downward motion of the actuator is not constrained by the comb drives, and very large deflections can be achieved in resonant operation [7]. Of course, depending on the manufacturing technique, the actuators can also be oriented differently, and the argumentation then applies accordingly. The present inventive concept optimizes such vertical comb actuators for the outlined boundary conditions.

The known microsystems with vertical comb drives can be divided into those where the electrodes (combs) lie in a common plane after completion and without applied voltage, and others where the static and movable electrodes each lie in an individual plane. The latter can be achieved by manufacturing the electrodes directly in different planes e.g. [8], by moving one part of the electrodes from their original position to a new resting position by a late step in the manufacturing process e.g. [9], or by shortening each of the two electrodes on different sides by a separate etching e.g. [10]. In all these cases, an actuator is generated that can be deflected analogously when a static address voltage is applied. In contrast, an actuator with both electrodes in one plane can only be resonantly excited and would not be suitable for the present object.

In the case of electrodes in two planes, those are known in conventional technology that already overlap or are immersed into each other in the resting position (without applied voltage), i.e., the lower edge of the upper electrode comb is lower than the upper edge of the lower comb, wherein the fingers each lie in the gaps of the other comb. This is chosen because, for a given design and address voltage, a comb drive does not develop its full force until the combs are immersed into each other.

Vertical comb drives have the advantage that they have no pull-in in the desired operating direction, and the deflection can therefore be even greater than the resting distance between the electrodes. Again, the smaller the horizontal distance between the electrode edges, the greater the desired vertical force. However, a lower limit for the horizontal electrode gap results from the much greater horizontal forces that the individual fingers apply onto each other. In perfectly manufactured systems, all horizontal forces add up to zero, but even the smallest inaccuracies can lead to enormous horizontal net forces that can even destroy such an actuator (horizontal pull-in). This effect is all the more critical the greater the immersion depth. The latter is of course even greater when the actuator is fully deflected than at rest.

There are also known systems where the electrodes are 'edge-to-edge' in the resting position or those where there is a small vertical gap. The latter is usually production-related due to an etch stop layer or connecting layer between the planes from which the electrodes were fabricated.

For micromirror arrays with a large number of pixels, it is often advantageous to separate the acting voltage into two contributions: a fixed voltage that is the same for all (or many) electrodes, which is called bias voltage and leads to an initial position of the actuators that differs from the voltage-free resting position, and an address voltage that is specific to each individual electrode and differs according to the desired position, which can be selected from two fixed voltage values in the case of digital addressing. The provision of the bias voltage can generate a greater actuator force at maximum deflection when the address voltage is limited, so that harder springs can be used, which is favorable for fast switching times. On the other hand, the bias voltage increases the risk of horizontal pull-in.

For all electrostatic actuators, the actuator force is proportional to the square of the voltage for a given configuration and deflection, see also the formula below. In addition, the force continues to increase as the movable actuator element approaches the electrode, resulting in a mostly undesirable strongly non-linear deflection characteristic curve during analog control. One way of linearizing the characteristic curve of plate actuators is described in [6]. Unfortunately, it can be difficult to apply for very small pixels.

Even with multi-stage digital plate actuators, a nonlinear increasing force results in the same way when the movable actuator element approaches the electrodes:

$$F_{electrostatic} = \frac{\varepsilon_0}{2} A_{electrode} \frac{U^2}{(g-d)^2}$$

wherein U indicates the applied voltage, g the gap of the movable actuator element from the considered electrode in the resting position (without voltage applied to any electrodes) and d the approximation or deflection of the actuator.

Here, this has the effect that the influence of each electrode on the amount of deflection across the current value of the effective plate gap (g-d) depends on the voltage values of the other electrodes. Thus, for increasing digital control values, unevenly graduated actuator positions are obtained. FIG. 7 shows this exemplarily for an addressing with 3 bit (=values from 0 to 7) for an otherwise ideal plate actuator in the deflection range 0 to 0.25 of the gap. With large deflection, here, only a bad resolution is obtained. The last step (from address value 6 to 7) is here about 3.4 times greater than the first (from 0 to 1). If the last step is made as small as the first one in this example, only about 2 bit more would be needed in addressing and accordingly more and more finely divided electrodes. This is very unfavorable, in particular for very small actuators.

SUMMARY

According to an embodiment, a MEMS actuator may have: a substrate, a first electrode structure that is stationary with respect to the substrate, wherein the first electrode structure includes a plurality of partial electrode structures, each of which includes an edge structure and can be electrically controlled separately and a second electrode structure with an edge structure, wherein the second electrode structure is deflectably coupled to the substrate by means of a spring structure and electronically deflectable by means of the first electrode structure to move the edge structure of the second electrode structure into a discrete deflection position, wherein the edge structures of the first and second electrode structures are configured to be opposite to each other with respect to a top view and the opposite portions are spaced apart by a lateral distance and wherein the individual partial electrode structures of the first electrode structure are configured to apply a different, equally directed electrostatic force on the second electrode structure based on an electric control voltage, and to deflect the second electrode structure into the discrete deflection position.

According to another embodiment, a MEMS actuator array may have: a plurality of inventive MEMS actuators and control means for individually controlling the respective partial electrode structures of the first electrode structures and/or for individually controlling the respective third electrode structure of the plurality of MEMS actuators, wherein the second electrode structures of the MEMS actuators can be deflectable into at least one deflection position each between the minimum deflection position and the maximum deflection position in the first electrode structure, based on the control voltage, and/or wherein the second electrode structures of the MEMS actuators are deflectable into at least one deflection position each between the maximum deflection position in the first electrode structure and the maximum deflection position in the third electrode structure, based on the further control voltage.

According to one aspect, a MEMS actuator comprises a substrate, a first electrode structure that is stationary with respect to the substrate, wherein the first electrode structure comprises a plurality of partial electrode structures, each of which comprises an edge structure and can be electrically controlled separately, and a second electrode structure with an edge structure, wherein the second electrode structure is deflectably coupled to the substrate by means of a spring structure and electrostatically deflectable by means of the first electrode structure to move the edge structure of the second electrode structure into a discrete deflection position, wherein the edge structures of the first and second electrode structures are configured to be opposite to each other with respect to a top view and the opposite portions are spaced apart by a lateral distance, and wherein the individual partial electrode structures of the first electrode structure are configured to apply a differing, equally directed (or equally aligned or equally oriented) electrostatic force onto the second electrode structure based on an electric control voltage and to deflect the second electrode structure into the discrete deflection position.

According to a further aspect, a MEMS actuator array comprises a plurality of MEMS actuators according to one of the preceding aspects and control means for individually controlling the respective partial electrode structures of the first electrode structures and/or for individually controlling the respective third electrode structure of the plurality of MEMS actuators, wherein the second electrode structures of the MEMS actuators are deflectable into at least one discrete deflection position, each between the minimum deflection position and the maximum deflection position in the first electrode structure, based on the control voltage and/or wherein the second electrode structures of the MEMS actuators are deflectable into at least a discrete deflection position, each between the maximum deflection position in the first electrode structure and a maximum deflection position in the third electrode structure, based on the further control voltage.

According to one aspect, the MEMS actuator comprises control means for selectively or individually controlling at least one subset of the partial electrode structures of the first electrode structure of the MEMS actuator with a discrete voltage value of the control voltage to obtain, based on the selected subset of partial electrode structures, a resulting electrostatic force on the second electrode structure with a respective change of the discrete deflection position of the edge structure of the second electrode structure.

According to an aspect, the electric control voltage comprises a plurality of different discrete voltage values, wherein, based on the different discrete voltage values of the electric control voltage, the edge structure of the second electrode structure is deflectable in different discrete vertically spaced-apart deflection positions.

According to an aspect, the electric control voltage comprises two different discrete voltage values to provide digital control of the MEMS actuator.

According to an aspect, the first electrode structure comprises "n" partial electrode structures that apply, at a discrete voltage value of the electric control voltage, an equally directed electrostatic force differing by a predetermined factor to the second electrode structure, wherein each of the "n" partial electrode structures can be allocated to a different bit position of a bit word, wherein the respective partial electrode structure is allocated to a higher value bit position of the bit word, the higher the electrostatic force of this partial electrode structure on the second electrode structure is during electric excitation, and wherein the value of the respective bit of the bit word reflects the activation state of the allocated partial electrode structure.

According to an aspect, the partial electrode structures of the first electrode structure differ with respect to their size and/or the respective lateral distance to the second electrode structure.

Here, a more significant bit of the n-bit word can, for example, have a greater effect (=application of an equally directed electrostatic force on the second electrode structure) than all other less significant bits of the n-bit word have together. The greater effect can, for example, have (1) LSB (=least significant bit).

The solution of the problem includes, for example, the usage of a comb drive having several electrically separate stationary electrodes (=separately controllable partial electrode structures of the first electrode structure) per MEMS actuator. The partial electrode structures differ regarding their size, i.e., the number of fingers or the edge length and/or the horizontal distance to the movable actuator element, i.e., the deflectable second electrode structure and therefore have a differing influence on the deflection.

With comb drives, a force that is mostly independent of the deflection can be generated. This has the effect that stepping becomes uniform when, for example, the following conditions are maintained.

According to an aspect, the first and second electrode structures are spaced apart by the lateral distance in a plane parallel to the substrate, wherein the second electrode structure comprises a first immersion depth in the minimum deflection position in the first electrode structure, wherein the first immersion depth or first deflection position is, for example, between −0.25 times (=distance), 0 times (=flush) or 0.5 times the value and 1.5 times the value of the lateral distance.

According to an aspect, in a maximum deflection position of the second electrode structure, in the first electrode structure a vertical overlap between the first and second electrode structures has at least 1 times, 1.5 times or 2 times the value of the lateral distance.

Thus, embodiments of the inventive concept allow the realization of a digitally controlled micromechanical electrostatic MEMS actuator with large deflection range with small lateral dimensions showing, compared to plate actuators common in this field, improved graduating of the deflections as well as very low crosstalk between adjacent pixels.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
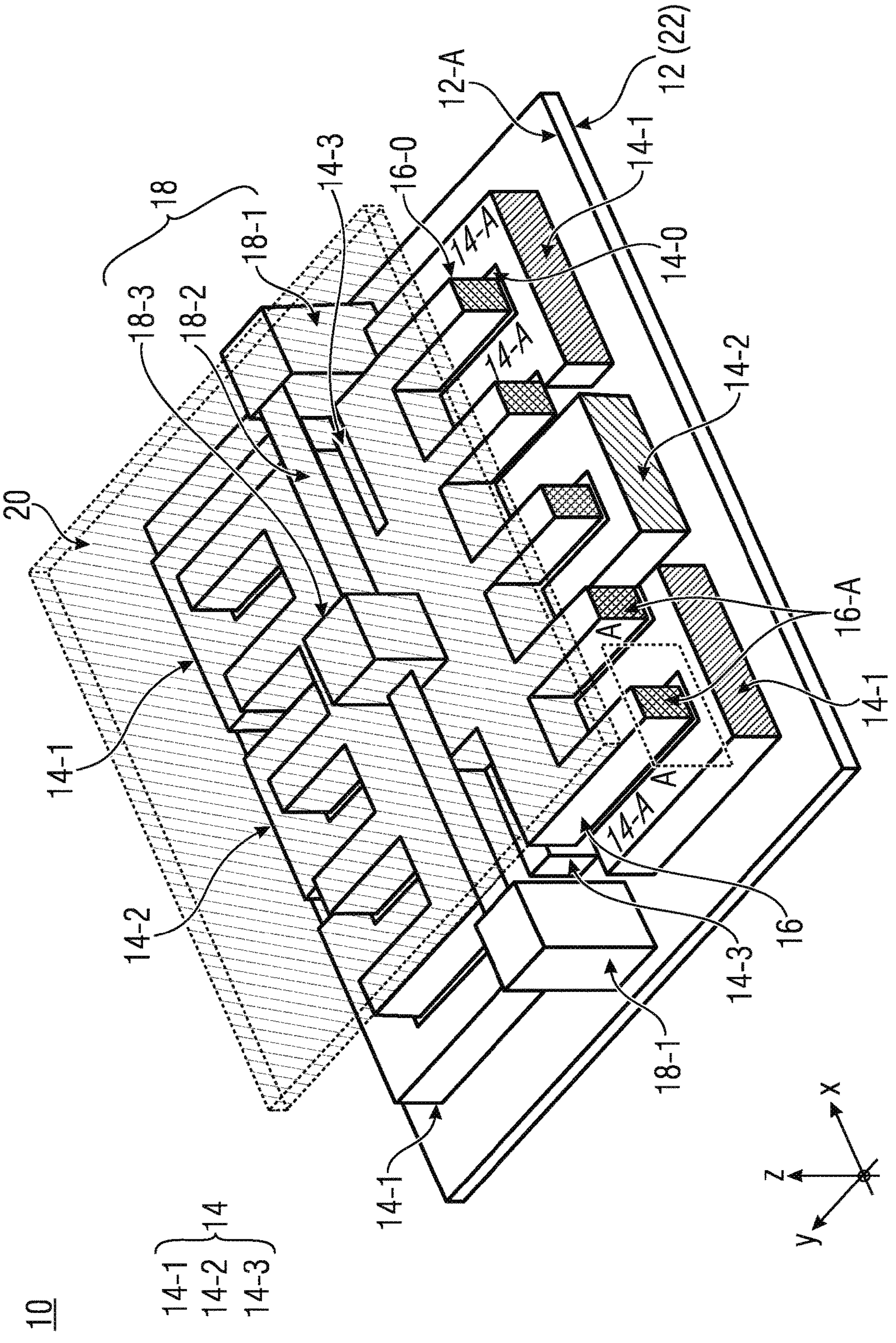
FIG. 1 is a schematic perspective view of a MEMS actuator according to an embodiment.

Before embodiments of the present concept will be discussed in more detail below based on the drawings, it should be noted that identical, functionally equal or equal elements, objects, functional blocks and/or method steps are provided with the same reference numbers in the different figures, such that the description of these elements, objects, functional blocks and/or method steps illustrated in the respective embodiments is inter-exchangeable or inter-applicable.

Different embodiments will now be described in detail with reference to the accompanying drawings, where some embodiments are illustrated. In the figures, dimensions of illustrated elements layers and/or areas might not be to scale for illustrating purposes.

It is obvious, when an element is referred to as being “connected” or “coupled” to another element, the same can be connected or coupled directly to the other element or intermediate elements can exist. When, in contrary, an element is referred to as being “directly”, “connected” or “coupled” to another element, no intermediate elements exist. Other terms used for describing the relationship between elements are to be interpreted similarly (e.g., “between”, compared to “directly between”, “adjacent” compared to “directly adjacent”, etc.).

For simplifying the description of the different embodiments, the figures have a Cartesian coordinate system, x, y, z, wherein the x-y-plane corresponds to the main surface area of the carrier or substrate or is parallel to the same, and wherein the vertical direction is perpendicular to the x-y plane. In the following description, the term “lateral” or “horizontal” means a direction in the x-y plane (or parallel thereto) wherein the term “vertical” indicates a direction in the ±z direction (or parallel thereto).

The following examples relate to microelectromechanical systems (MEMS) that are configured to deflect a movable electrode structure that can be mechanically coupled to a functional element. Although subsequent embodiments relate to moveable functional elements including a mirror, in particular a micromirror, any other functional elements can be arranged, both in the optical area, such as lenses, filter or the same, but also in other fields such as for producing an electric contact or changing a mechanical distance.

MEMS can be produced in semiconductor technology, wherein here in particular multilayer arrangements are considered, including conductive, insulating or semi-conductive layers that can be spaced apart by the same layers or air gaps. MEMS can, for example, be obtained by a multilayer structure, which is reduced by selectively removing stack material, such as by an etching process, to expose MEMS structures. A silicon material, such as monocrystalline silicon, polycrystalline silicon or a doped silicon material can be used as a substrate. In different layers, conductivity can be generated, for example, to provide the functionality of an electrode. Other layers can, for example, be metalized such as to produce a reflecting surface and/or an electrically conductive surface.

In the following, an exemplary configuration of a MEMS actuator 10 according to an embodiment will be discussed in more detail based on FIGS. 1 and 2*a*-*b*.

Figures 2A, 2B:
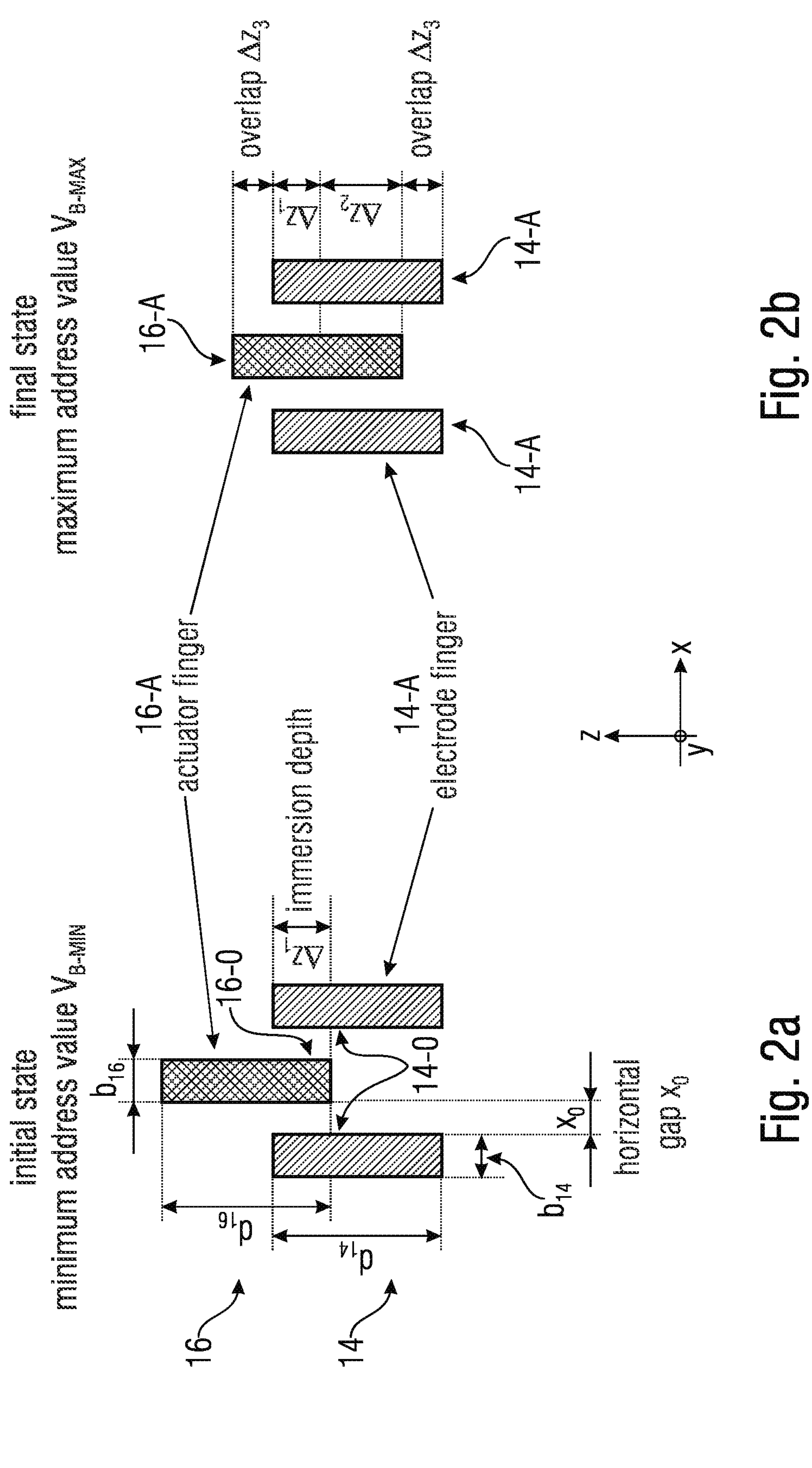
FIG. 2*a-b* are schematic partial cross-sectional views through a portion of the edge structure of the first electrode structure and an opposite portion of the edge structure of the second electrode structure in an initial state (minimum address value—FIG. 2*a*) and an end state or final state (maximum address value—FIG. 2*b*) according to an embodiment.

FIG. 1 shows a schematic perspective view of the MEMS actuator 10 according to an embodiment, while FIG. 2*a*-*b* each show a schematic partial cross-sectional view along an intersecting line A-A in FIG. 1 and parallel to the x z plane through a portion of a partial electrode structure 14-1 of the first electrode structure 14 and an opposite portion of the second electrode structure 16 in an initial state (FIG. 2*a*) and an end state (FIG. 2*b*).

The MEMS actuator 10 includes a substrate 12, for example a complete wafer or semiconductor wafer or alternatively a partly or completely singulated portion of the wafer. The substrate 12 can form a main surface area 12-A parallel to the substrate plane (parallel to the X Y plane) and extend at least partly in the substrate plane. The substrate plane is, for example, arranged in parallel to a main side 12-A of a wafer (not shown in FIG. 1), which can simply be referred to as upper side or lower side without these terms having any limiting effect. Terms like upper, lower, left, right, front and rear are variable or exchangeable based on an amended orientation of the MEMS actuator 10 in space.

Further, the MEMS actuator 10 includes a first electrode structure 14 that is stationary with respect to the substrate. The first electrode structure 14 comprises a plurality (e.g., n) of partial electrode structures 14-1, . . . , 14-*n*, each of which comprises an edge structure 14-0 and can be electrically controlled separately, i.e., can be supplied with an electric control signal or a control voltage. The first electrode structure 14 with the partial electrode structures 14-1, . . . , 14-*n* can be arranged on or directly on the main surface area 12-A of the substrate 12. According to an embodiment, the first electrode structure 14 can be arranged, for example, spaced-apart from the main surface area 12-A of the substrate 12 by means of spacing elements (not shown in FIG. 1), wherein in this regard, for example, reference is made to FIG. 4 and the allocated description.

Further, the MEMS actuator 10 includes a second electrode structure 16 with an edge structure 16-0, wherein the second electrode structure 16 is coupled deflectably to the substrate 12 by means of a spring structure 18 and is electronically deflectable by means of the first electrode structure 14 to move or deflect the edge structure 16-0 of the second electrode structure 16 into a discrete deflection position z of a plurality of possible discrete deflection positions z with respect to the edge structure 14-0 of the first electrode structure 14.

As illustrated exemplarily in FIG. 1, the first electrode structure 14 comprises, for example, three (n=3) partial electrode structures 14-1, 14-2, 14-3, wherein portions of the partial electrode structure 14-1 are arranged on the corner areas of the first electrode structure 14, wherein portions of the second partial electrode structure 14-2 are arranged laterally (in x direction) between portions of the first partial electrode structure 14-1, and wherein portions of the third partial electrode structure 14-3 are arranged laterally (in y direction) between further portions of the first partial electrode structure 14-1. As illustrated exemplarily in FIG. 1, the first partial electrode structure 14-1 comprises four electrically connected portions, while the second partial electrode structure 14-2 comprises two electrically connected portions and the third partial electrode structure 14-2 comprises two electrically connected portions.

The different partial electrode structures 14-1, 14-2, 14-3 are configured in a separately controllable manner to apply, based on an electric control voltage $V_S$ of the individual partial electrode structures 14-1, 14-2, 14-3, a different, equally directed electrostatic force by the different partial electrode structures 14-1, 14-2, 14-3 on the second electrode structure 16 and to deflect the second electrode structure 16 in one of the discrete deflection positions z.

The selectively or individually controllable partial electrode structures 14-1, 14-2, 14-3 of the first electrode structure 14 differ with regard to their geometric configuration, e.g., their size, e.g., the number of fingers or the edge length and/or the horizontal distance to the deflectable second electrode structure 16. Thus, the selectively controllable partial electrode structures 14-1, 14-2, 14-3 of the first electrode structure 14 have a varying degree of influence on the deflection of the second electrode structure 16.

However, the configuration of the partial electrode structures 14-1, 14-2, 14-3 of the first electrode structure 14 shown in FIG. 1 is to be regarded only as exemplary, wherein the number "n" and the geometric configuration and arrangement of the controllable partial electrode structures 14-1, . . . , **14-*n* of the first electrode structure 14 as well as the geometric configuration and arrangement of the respective sections of the controllable partial electrode structures 14-1, . . . , 14-*n* can differ from the representation in FIG. 1 according to the respective application. The number n of partial electrode structures can, for example, be in a range of 2-8 (2, 3, 4, . . . , 7, 8** or even above):

In the MEMS actuator 10, the opposite portions of the edge structures 14-0, 16-0 of the first and second electrode structures 14, 16 are spaced apart from each other by a lateral or horizontal distance $x_0$ (in the x-y plane) (see FIGS. **2*a*-*b*). The lateral distance $x_0$ thus refers (in a top view) to laterally opposite portions of the edge structures 14-0, 16-0 of the first and second electrode structures 14, 16. The individual partial electrode structures 14-1, . . . , 14-*n* of the first electrode structure 14 are now configured to apply a different, equally directed electrostatic force on the second electrode structure 16 based on an electric control voltage $V_S$ and to deflect the second electrode structure 16** into one of the discrete deflection positions z.

In the embodiment of the MEMS actuator shown in FIG. 1, the second electrode structure 16 is deflectable in a translatory manner with respect to the first electrode structure 14. As shown exemplarily in FIG. **1*a*, the spring structure 18 can have two poles or substrate extensions 18-1, wherein one spring element 18-2 is arranged between the two poles 18-1, i.e., clamped between the two poles 18-1 or supported on the same and hence forms a spring element 18-2 clamped on both sides. Further, a connecting element 18-3 is arranged on the spring element 18-2, which is mechanically connected to the second electrode structure 16. The spring element 18-2 adjusts a spring force counteracting, for example, the electrostatically effected deflection of the second electrode structure 16 vertically (in −z-direction) to the first electrode structure 14**.

Thus, embodiments relate to micromechanical actuators 10 that are controlled electrostatically, e.g., with a bias voltage $U_{BIAS}$ and that have a restoring elastic suspension 18 applying a respective counterforce for static balance deflection in order to bring the second electrode structure 16 into the minimum deflection position $z_{MIN}$.

Further, the MEMS actuator element 10 can comprise a functional element 20 that is mechanically firmly coupled also to the second electrode structure 16 by means of the connecting element 18-3. The functional element 20 can be an element whose translatory and/or rotatory position can be adjusted, controlled or at least influenced by the electrostatic deflection between the first and second electrode structures 14, 16. The functional element 20, for example, can be a micromirror and/or an electrically conductive structure.

According to an embodiment, the connecting element 18-3 can be mechanically coupled to the functional element 20 at a centroid of the same, wherein the connecting element 18-3 can further be mechanically coupled to the second electrode structure 16 at a centroid of the same. This symmetrical arrangement is only exemplarily, wherein other configurations can be selected as will be illustrated in the following embodiments.

As further illustrated exemplarily in FIG. **1*a*, the edge structure 16-1 of the second electrode structure 16 can be configured, with respect to a top view (and parallel to the x y plane), to engage the edge structure 14-1 of the first electrode structure 14. In that way, the edge structure 14-1 of the first electrode structure 14 can comprise a finger or comb structure, wherein the edge structure 16-1 of the second electrode structure 16** can comprise a further opposite finger or comb structure.

In this case, for example, this is referred to as "comb drive" that is formed by the first and second electrode structures 14, 16. However, in this context, it should be noted that the term "comb drive" is not to be considered in a limiting sense, since also only a few finger or comb elements 14-2, 16-2 can be used for the first and/or second electrode structures 14, 16.

Further, according to the present functional principle, the first and/or second electrode structure 14, 16 can be used as edge elements without finger or comb elements, wherein the first and second electrode structures 14, 16 function equally according to the basic principles described herein. In that way, for example, the first electrode 14 can be configured as a circumferential structure to the second electrode structure 16 in a top view (and parallel to the x-y plane). Generally, this can also be referred to as an electrostatic edge actuator element, as the actuator force is proportional to the length of the opposite edge structures 14-1, 16-1 of the first and the second electrode structures 14, 16.

As far as the producible structure sizes allow, a finger or comb structure for the edge structure 14-1, 16-1 of the first and second electrode structure 14, 16 can be more effectively used, wherein in FIG. **1*a*, according to an embodiment, the MEMS actuator element 10 comprises first and second electrode structures 14, 16 having only a few finger elements 14-2, 16-2, such that the resulting MEMS actuator elements 10** can be densely arranged in the substrate plane and can have pixel sizes of approximately only around 8 to 16 times the minimum structure size. Generally, the value of the smallest structure that can be reliably produced photolithographically is referred to as minimum structure size.

In this context, it is noted that the initial state (having a minimum address value, i.e., a minimum control voltage $V_S$)

does not need to correspond to a force-free position of the second electrode structure 16 arranged on the spring structure 18, since, for example, the electric control voltage $V_S$ can further comprise a constant portion in the form of an electric bias voltage $V_{BIAS}$. According to an embodiment, the control voltage $V_S$ can thus comprise a bias voltage portion (a bias voltage) $V_{Bias}$ and an operating voltage portion $V_B$. According to another embodiment, the control voltage $V_S$ can only comprise the operating voltage portion $V_B$.

According to an embodiment, the MEMS actuator 10 can further comprise control means 22 for providing the control voltage $V_S$ between the first and second electrode structures 14, 16 of the MEMS actuator 10. Here, the control means 22 can be configured to selectively control at least a subset or all of the partial electrode structures 14-1, . . . , **14-*n* of the first electrode structure 14 of the MEMS actuator 10 with a discrete voltage value of the control voltage $V_S$ to obtain, based on the selected subset of the partial electrode structures 14-1, . . . , 14-*n*, a resulting electrostatic force on the second electrode structure 16 with a corresponding change in the discrete deflection position z of the edge structure 16-0 of the second electrode structure 16 with respect to the edge structure 14-0 of the first electrode structure 14**.

According to an embodiment, the electric control voltage $V_S$ provided by control means 22 can comprise a plurality of different discrete voltage values (signal levels) $V_{Si}$ to provide discrete control of the MEMS actuator 10, wherein, based on the different discrete voltage values $V_{Si}$ of the electric control voltage $V_S$, the edge structure 16-0 of the second electrode structure 16 is deflectable into different discrete, vertically spaced-apart deflection positions z with respect to the edge structure 14-0 of the first electrode structure 14. For example, several different discrete voltage values $V_{Si}$ with i=2, 3 or 4 (or even more) can be used. Thus, different partial electrode structures 14-1, . . . , **14-*n* of the first electrode structure also 14** can each be controlled with a different discrete voltage value $V_{Si}$ of the electric control voltage $V_S$.

According to an embodiment, the electric control voltage $V_S$ provided by the control means 22 can have two different discrete voltage values $V_{S1}$, $V_{S2}$ to provide digital control of the MEMS actuator 10.

For example, the control means 22 can be integrated in the semiconductor material of the substrate 12 or can be external to the substrate and electrically connected to the partial electrode structures 14-1, . . . , **14-*n* of the first electrode structure 14 and the second electrode structure 16**.

Thus, according to an embodiment, the first electrode structure can comprise “n” partial electrode structures which, at a discrete voltage value of the electric control voltage, apply an equally directed electrostatic force on the second electrode structure 16 which differs, for example, by a predetermined factor. Thus, each of the “n” partial electrode structures can be allocated to a different bit position of a bit word, wherein the respective partial electrode structure is allocated to a bit position of the bit word of higher significance the greater the electrostatic force of this partial electrode structure **14-*n* on the second electrode structure 16 during electric excitation, and wherein the value of the respective bit of the bit word reflects the activation state of the allocated partial electrode structure. Thus, an n-bit word can be used to control the “n” partial electrode structures 14-1, . . . , 14-*n*** of the first electrode structure.

According to an embodiment, the partial electrode structures 14-1, . . . , **14-*n*** can be configured such that their influence on the deflection differs in each case by a factor of 2, e.g., by the number of fingers or edge lengths differing by a factor of 2 for a constant horizontal gap, or by the same edge lengths for horizontal gaps graded by the factor of √2.

According to another embodiment, the partial electrode structures 14-1, . . . , **14-*n* can be graded in both edge length and horizontal gap, in which case one of the factors (per bit) can be selected and the other results from the double influence requirement. Then the partial electrode structures 14-1, . . . , 14-*n*** can simply be allocated directly to the different bits of the address value.

These implementations and configurations are to be considered as being exemplary only and can vary depending on the field of application of the MEMS actuator 10.

FIG. **2*a* shows a schematic partial cross-sectional view along a section line A-A in FIG. 1 and parallel to the x-z plane through a portion of a partial electrode structure 14-1 of the first electrode structure 14 and an opposite portion of the second electrode structure 16 in an initial state. In the initial state, the operating voltage $V_B$ (i.e., the variable portion of the control voltage $V_S$) can comprise a minimum operating voltage value $V_{B-MIN}$. Thus, for a number n=3 of partial electrode structures 14-1, . . . , 14-*n*** of the first electrode structure, there can be a minimum address value that can be allocated to an n-bit word (here, a 3-bit word) having a bit value of “000”.

FIG. **2*b* shows a schematic partial cross-sectional view along a section line A-A in FIG. 1 and parallel to the x-z plane through a portion of a partial electrode structure 14-1 of the first electrode structure 14 and an opposite portion of the second electrode structure 16 in a final state. In the final state, the operating voltage $V_B$ (i.e., the variable portion of the control voltage $V_S$) can have a maximum operating voltage value $V_{B-MAX}$. Thus, for a number n=3 of partial electrode structures 14-1, . . . , 14-*n*** of the first electrode structure, there can be a maximum address value that can be allocated to an n-bit word (here, a 3-bit word) having the bit value “111”.

Based on the illustration in FIGS. **2*a-b* of the portions or finger elements 14-A, 16-A of the edge structures 14-0, 16-0 of the first and second electrode structures 14, 16, both the relative positions and deflection paths of the edge structures 14-0, 16-0 of the first and second electrode structures 14, 16 of the MEMS actuator 10 with respect to each other and typical dimensions of the edge structures 14-0, 16-0 of the first and second electrode structures 14, 16** will be explained.

Thus, FIG. **2*a-b* shows two individual finger elements 16-A of the edge structure 16-0 of the second electrode structure 16 and a finger element 14-A of the edge structure 14-0 of one of the partial electrode structures 14-1, . . . , 14-*n* of the first electrode structure 14 moving relative thereto. The arrangement of the finger elements 14-A, 16-A of the edge structures 14-0, 16-0 shown in FIGS. 2*a-b* can be continued periodically (at least in portions) to form the circumferential edge structures 14-0 and 16-0 of the first and second electrode structures 14, 16**.

As illustrated exemplarily in FIGS. **2*a-b*, the finger elements 14-0 of the first electrode structure 14 have a vertical thickness $d_{14}$ (in the z-direction) and a lateral width $b_{14}$ (in the x-y plane). The finger elements 16-A of the second electrode structure 16 have a vertical thickness $d_{16}$ and a lateral (horizontal) width $b_{16}$. As previously explained, FIG. 2*a* represents an initial state or base state in a minimum deflection position $\Delta z_1$ (minimum immersion depth) of the MEMS actuator 10, while FIG. 2*b* represents a final state in a maximum deflection position $\Delta z_2$ (=maximum immersion depth) with a remaining vertical overlap $\Delta z_3$ between the first and second electrode structures 14, 16**. The minimum and maximum deflection positions indicate a maximum deflection path $\Delta z_2$, wherein the discrete deflection position z is located at a vertical position (parallel to the z-direction) along the maximum deflection path $\Delta z_2$.

According to an embodiment, the MEMS actuator 10 can include a micromirror element as the functional element 20 coupled to the second electrode structure 16. For example, in applications for visible light, the following dimensions of the MEMS actuator 10 can be present for a minimum structure: $x_0 \approx 200$ nm, $d_{14}=d_{16}\approx 1000$ nm, $b_{14}=b_{16}\approx 400$ nm. These values are to be considered as examples only and can vary depending on the application of the MEMS actuator 10.

Figure 3:
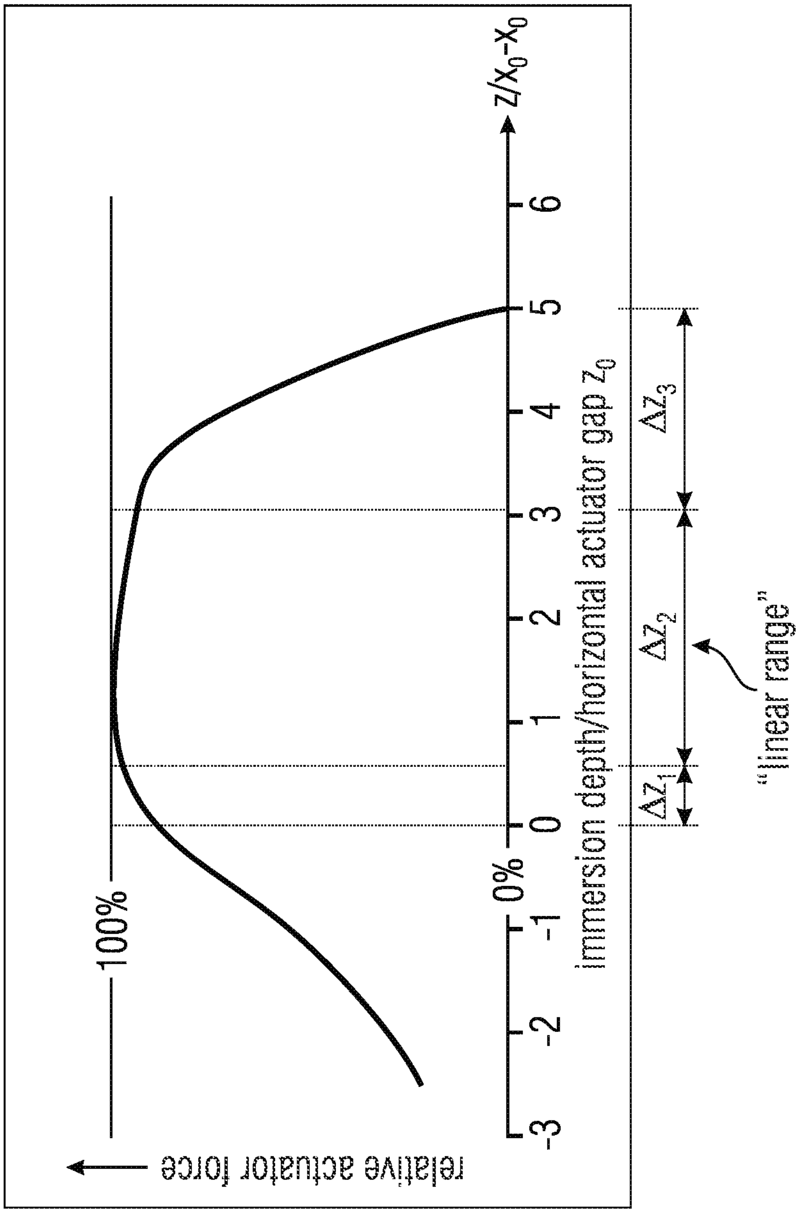
FIG. 3 is a qualitative course of the actuator force with fixed control voltage with respect to the immersion depth of the second electrode structure in the first electrode structure for a comb drive according to an embodiment.

FIG. 3 shows a qualitative course of the (relative) actuator force with a fixed control voltage $V_S$ with respect to the immersion depth or the discrete deflection positions z of the second electrode structure 16 with respect to the first electrode structure 14, exemplary for a comb drive according to an embodiment. In the embodiment, the finger elements (=combs) 14-A, 16-A have a vertical thickness (height) $d_{14}$, $d_{16}$ corresponding to 5 times the value of the lateral distance (=horizontal gap) $x_0$. Thus, in the embodiment of FIG. 3, at the point z=0, the plane of the lower edge of the finger elements 16-A of the second electrode structure 16 correspond to the plane of the upper edge of the finger elements 46-A of the first electrode structure 14, while the point z=5 corresponds to a complete vertical overlap of the finger elements 14-A, 16-A of the first and second electrode structures 14, 16. Negative values of the immersion depth correspond to a vertical distance between the first and second electrode structures 14, 16. As becomes clear from FIG. 3, the relative actuator force is almost independent of the deflection position z across a wide range (e.g., between 0.5 times the value and 2.5 or 3 times the value of the lateral distance $x_0$.

According to an embodiment, the first and second electrode structures 14, 16 or the edge structures 14-0, 16-0 are spaced apart by the lateral distance $x_0$ in a plane (x-y plane) parallel to the substrate 12, wherein the second electrode structure 16 has a first immersion depth in the minimum deflection position with respect to the first electrode structure, wherein the first immersion depth or first deflection position $\Delta z_1$ is, for example, at least −0.25 times, 0 times or 0.5 times the lateral distance $x_0$ or wherein the first immersion depth is between −0.25 times, 0 times or 0.5 times the value and 1.5 times the value of the lateral distance $x_0$.

FIG. 3 shows an example of 0.5 times the value of the lateral distance $x_0$ for the first immersion depth $\Delta z_1$. Thus, for a best possible linearity of the relative actuator force, the first immersion depth $\Delta z_1$ at minimum deflection (in the initial position) can be at least half as large as the horizontal distance $x_0$ of the opposite portions of the effective edge structures 14-0, 16-0 of the first and second electrode structures 14, 16.

If a lower accuracy with lower requirements on the linearity of the relative actuator force is tolerable, the first immersion depth $\Delta z_1$ at minimum deflection can essentially only be greater than zero, with $\Delta z_1>0$. If an even lower accuracy with lower requirements on the linearity of the relative actuator force is tolerable, the immersion depth or first deflection position $\Delta z_1$ at minimum deflection can have essentially a negative value, a vertical initial distance $\Delta z_1$ of up to a quarter of the horizontal distance $x_0$, with $\Delta z_1 \geq -\frac{1}{4}$ $x_0$ can be allowed. This implementation can be possibly be attractive, since it allows a relatively simple manufacturing procedure even for cases without bias voltage $V_{BIAS}$.

According to an embodiment, further, in a maximum immersion or deflection position $\Delta z_2$ of the second electrode structure 16 with respect to the first electrode structure 14, a vertical overlap or offset $\Delta z_3$ between the first and second electrode structures 14, 16 is at least 1 time, 1.5 times or 2 times the value $x_0$ of the opposite portions of the effective edge structures 14-0, 16-0 of the first and second electrode structures 14, 16, in order to obtain the best possible linearity of the relative actuator force up to the maximum deflection (in the end position) $\Delta z_2$.

FIG. 3 illustrates exemplarily 2 times the value of the lateral distance $x_0$ for the overlap (=second immersion depth) $\Delta z_3$. The overlap $\Delta z_3$ at maximum deflection (in the end position) can therefore be at least twice as large as the horizontal distance $x_0$ of the opposite portions of the effective edge structures 14-0, 16-0 of the first and second electrode structures 14, 16 for the best possible linearity of the relative actuator force.

If a lower accuracy with lower requirements on the linearity of the relative actuator force can be tolerated, the second immersion depth $z_2$ at maximum deflection can be at least greater than 1.5 times the value of the horizontal distance $x_0$.

If an even lower accuracy with lower requirements on the linearity of the relative actuator force can be tolerated, an overlap of at least the horizontal distance $x_0$ can be sufficient for the second immersion depth or deflection position $z_2$ at maximum deflection.

According to embodiments, a digitally controlled, multistage, electrostatic MEMS actuator 10 can thus be provided, with which a deflection that is as uniformly graded as possible can be obtained, wherein even with very small, densely packed MEMS actuators 10, the maximum deflection and the actuator force can be as large as possible and a crosstalk between the electrodes or electrode structures 14, 16 of a pixel as well as those of the adjacent pixels can be as small as possible.

According to embodiments, the MEMS actuator 10 can be used with a comb drive, wherein the first electrode structure 14 that is stationary with respect to the substrate, comprises a plurality (n) of partial electrode structures 14-1, . . . , 14-*n*, which form an edge structure 14-0 of the first electrode structure 14 and can be electrically controlled separately. The partial electrode structures 14-1, . . . , 14-*n* differ in size, such as the number of fingers or edge length, and/or the horizontal distance $x_0$ to the movable second electrode structure and thus have a differing influence on the deflection z.

With comb drives, a force largely independent of the deflection can be generated in the range $\Delta z_3$, as explained above with reference to FIG. 3. This ensures that the gradation becomes uniform when the conditions for the immersion depth $\Delta z_1$ and the overlap $\Delta z_3$ explained with reference to FIG. 3 are met.

As a result, the finger elements (=combs) 14-A, 16-A of the first and second electrode structure have a vertical thickness (height) $d_{14}$, $d_{16}$ that corresponds to the sum of immersion depth $\Delta z_1$, linear area $\Delta z_2$ and overlap $\Delta z_3$, with $d_{14}=\Delta z_1+\Delta z_2+\Delta z_3$ or $d_{16}=\Delta z_1+\Delta z_2+\Delta z_3$. According to an embodiment, the vertical thickness (height) $d_{14}$, $d_{16}$ of the finger elements (=combs) 14-A, 16-A of the first and second electrode structures 14, 16 can be equal, with $d_{14}=d_{16}$. The vertical thickness (height) $d_{14}$, $d_{16}$ can also be different, for example, due to manufacturing, with $d_{14}\neq d_{16}$.

In this regard, it is noted that the immersion depth or first deflection position $\Delta z_1$ can also have a negative value at minimum deflection, e.g. with $\Delta z_1 \geq -\frac{1}{4}x_0$.

On the one hand, the desired initial immersion depth $\Delta z_1$ of the mechanically connected finger elements or combs 14-A, 16-A of the first and second electrode structures 14, 16 into each other can be formed directly during production of the MEMS actuator 10. However, it is often easier to produce the finger elements 14-A, 16-A in completely separate production planes, possibly even with a (thin) separation layer inbetween. The needed immersion depth $\Delta z_1$ of the initial layer can then be achieved by applying the bias voltage $V_{BIAS}$. If this is not desired, the minimum immersion depth or deflection position $\Delta z_1$ can also be achieved by other measures, e.g. by a defined stress gradient in the spring plane, or by mechanical deflection during assembly in a housing (not shown).

In this context, it is pointed out once again that the term “comb drive” should be understood very generally here (especially with regard to very small pixels 10), since electrode structures 14, 16 with only a few finger elements 14-A, 16-A or even electrode structures 14, 16 without any finger elements at all also function according to the same principles.

Thus, according to the present functional principle, the first and/or second electrode structures 14, 16 can be used as edge elements without finger or comb elements, wherein the first and second electrode structures 14, 16 function equally according to the principles described herein. For example, the first electrode structure 14 can be formed as a circumferential structure to the second electrode structure 16 in a top view (parallel to the x-y plane). Thus, the partial electrode structure 14-3 for bit “0” in FIG. 1 is also a comb drive in this sense.

In general, it is then also possible to speak of an electrostatic edge actuator, since the actuator force is proportional to the length of the opposite edge structures 14-1, 16-1 of the first and second electrode structures 14, 16. Providing finger elements 14-A, 16-A can provide further advantage as far as the manufacturable (minimum) structure sizes allow.

FIGS. 1 and 2*a-b* each show finger elements 14-A, 16-A connected at their ends in the same plane to form combs. Alternatively, the finger elements 14-A, 16-A could be connected to each other at their upper or lower sides. In this case, the connecting element would also attract the opposite comb, which would again result in a deflection-dependent force and thus negatively affects the uniformity of the deflection gradation. Thus, laterally connected combs provide good properties. If vertically connected combs are to be used, the height $d_{14}$, $d_{16}$ of the finger elements 14-A, 16-A and the overlap $\Delta z_1$ needed above should be increased by at least a distance of two fingers of the same comb to keep the disadvantages low.

According to embodiments, the electrostatic field is limited in a spatially narrow range around the electrode fingers 14-A, 16-A in comb actuators due to the small electrode gap $x_0$. This provides actuator forces that can be much larger in the same pixel area compared to a plate actuator, even if only a few fingers are possible given the minimum size of the structures due to manufacturing constraints. This alone is a decisive advantage, since it allows stronger springs and a faster response of the actuator. Surface micromechanics allow much finer structures compared to bulk micromechanics and are therefore advantageous. In addition, the comb drive allows very low crosstalk between the electrodes of the same, as well as the adjacent actuator.

Since the main portion of the electric field is located between the finger elements 14-A and 16-A, the region of high field strength is concentrated in a small area of space. The low field strength of the electric field in the external space results in low crosstalk to adjacent MEMS actuators 10.

Figures 4, 5:
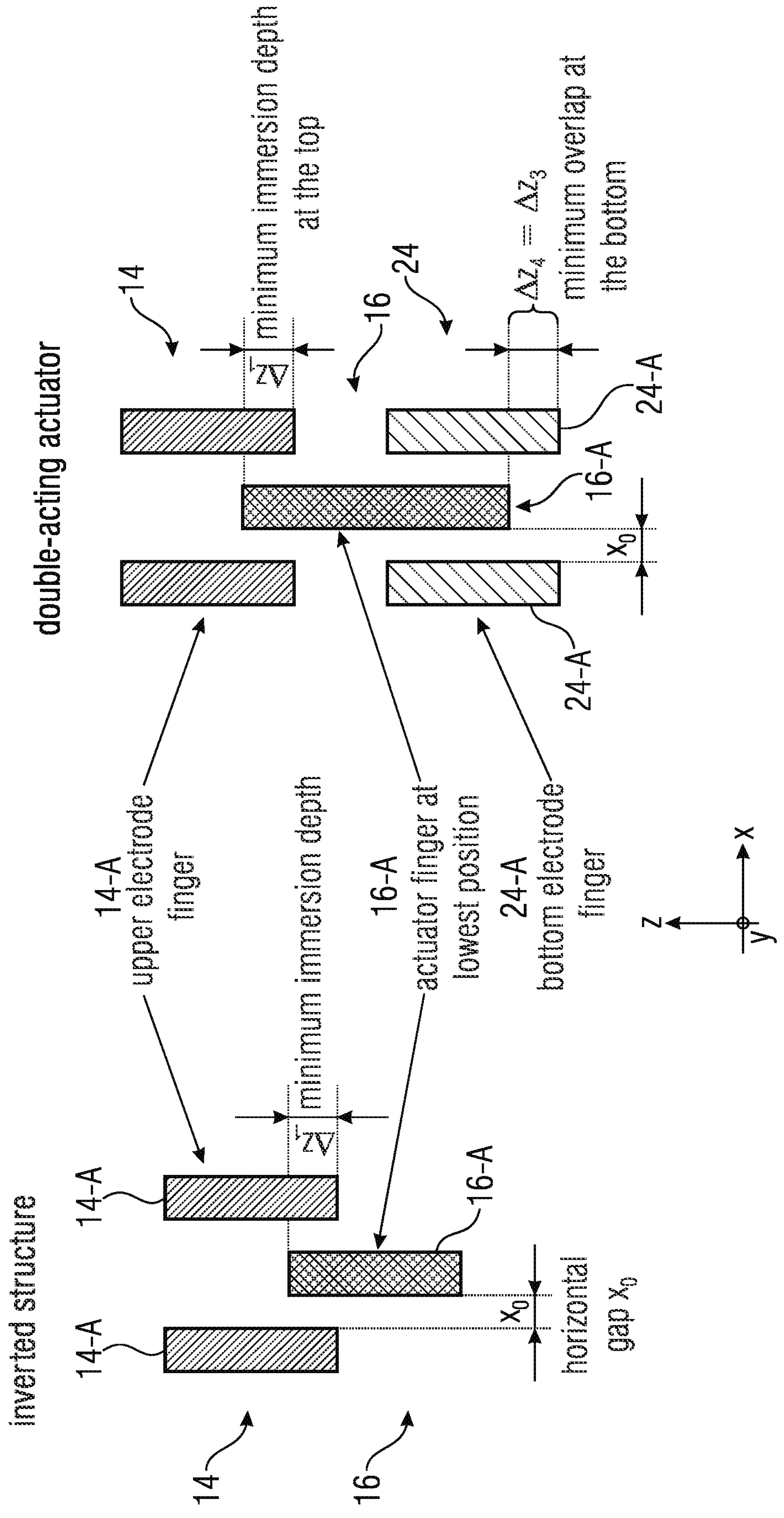
FIG. 4 is a schematic partial cross-sectional view through a portion of the edge structure of the first electrode structure and an opposite portion of the edge structure of the second electrode structure of the MEMS actuator with inverted structure according to a further embodiment.
FIG. 5 is a schematic partial cross-sectional view through part of a MEMS actuator according to a further embodiment, wherein the MEMS actuator is configured as double-acting actuator.

FIG. 4 is a schematic partial cross-sectional view through a portion of the edge structure 14-0 of the first electrode structure 14 and an opposite portion of the edge structure 16-0 of the second electrode structure 16 of the MEMS actuator 10 with inverted structure according to another embodiment.

The MEMS actuator 10 again comprises the first electrode structure 14 with an edge structure 14-0, wherein the first electrode structure 14 with the edge structure 14-0 is arranged stationary with respect to the substrate 12. The first electrode structure 14 with the edge structure 14-0 is arranged spaced apart from the main surface area 12-A of the substrate 12 by means of spacing elements (not shown in FIG. 4). The spacing elements (posts) can be part of the first electrode structure 14 and/or the substrate 12.

The MEMS actuator 10 has an upper first electrode structure (stator) 14 with the finger elements (stator fingers) 14-A of the edge structure 14-0, wherein the second electrode structure (actuator) 16 with the finger elements (actuator fingers) 16-0 of the edge structure 16-0 is arranged vertically (in the resting position) between the first electrode structure 14 and the substrate 12.

The lateral distance $x_0$ again refers (in a top view) to laterally opposite portions of the edge structures 14-0, 16-0 of the first and second electrode structures 14, 16, wherein FIG. 4 illustrates an initial state or base state in a minimum deflection position $\Delta z_1$ (minimum immersion depth) of the MEMS actuator 10.

The MEMS actuator 10 can further comprise a conductive baseplate (not shown in FIG. 4) for shielding the influence of underlying electronics (not shown). The conductive ground plane can be configured as part of the substrate 12. Unlike in the above embodiments, it can be advantageous to arrange the stationary electrode structure 14 (the stator) vertically above the movable electrode structure 16, i.e., on the side facing away from the substrate 12.

FIG. 4 thus shows another example of a MEMS actuator 10 with only a few finger elements 14-A, 16-A, which can be densely arranged in the substrate plane or parallel to the substrate plane and can have dimensions for the MEMS actuator 10 (=pixel sizes) of only about eight to sixteen times the minimum structure size.

FIG. 5 shows a schematic partial cross-sectional view through part of a MEMS actuator 10 according to a further embodiment, wherein the MEMS actuator 10 is configured as a double-acting actuator.

According to an embodiment, the MEMS actuator 10 can comprise a third electrode structure 24 that is stationary with respect to the substrate 12, wherein the second electrode structure 16 is disposed (e.g., symmetrically) between the first and third electrode structures 14, 24 and is deflectable. Here, the second electrode structure 16 is electrostatically deflectable by means of the third electrode structure 24 to move the edge structure 16-0 of the second electrode structure 16 to a further discrete deflection position $z_3$. The first and third electrode structures 14, 24 are configured to apply an opposite electrostatic force on the second electrode structure 16 during electrical excitation.

According to an embodiment, the third electrode structure 24 can comprise one partial electrode structure 24 or even a plurality of partial electrode structures 24-*m* (not shown in FIG. 5), each of which comprises an edge structure 24-0 and can be electrically controlled separately. Here, the individual partial electrode structures 24-*m* of the third electrode structure 24 can be configured to apply a different, equally directed electrostatic force on the second electrode structure 16 during electrical excitation.

According to an embodiment, the third electrode structure can thus also comprise a plurality "m" of partial electrode structures 24-*m* (not shown in FIG. 5) that apply an equally directed electrostatic force on the second electrode structure 16 which differs, for example, by a predetermined factor, at a discrete voltage value of the electric control voltage $V_S$. Thus, each of the "m" partial electrode structures can be allocated to a different bit position of a bit word, wherein the respective partial electrode structure is allocated to a bit position of the bit word of higher significance the greater the electrostatic force of this partial electrode structure 14-*n* on the second electrode structure 16 during electrical excitation, and wherein the value of the respective bit of the bit word reflects the activation state of the allocated partial electrode structure. Thus, an m-bit word can be used to control the "m" partial electrode structures 24-1, . . . , 24-*n* of the third electrode structure 24.

According to an embodiment, the second and third electrode structures 16, 24 can be spaced apart by the lateral distance $x'_0$ in a top view (x-y plane) parallel to the substrate 12, wherein the second electrode structure 16 comprises an overlap $\Delta z_4$ (e.g. $\Delta z_4=\Delta z_3$), wherein the vertical overlap $\Delta z_4$ between the second and third electrode structures 16, 24 comprises at least 1 times, 1.5 times or 2 times the value of the lateral distance $x_0$, and wherein the immersion depth or deflection position $\Delta z_1$ of the second electrode structure 16 in the first electrode structure 14 is between −0.25 times (=distance), 0 times (=flush) or 0.5 times the value and 1.5 times the value of the lateral distance $x_0$. In the maximum deflection position (not shown in FIG. 5), the second electrode structure 16 comprises the overlap $\Delta z_3$ in the first electrode structure 24, wherein the second electrode structure 16 comprises the immersion depth $\Delta z_1$ in the third electrode structure 24.

FIG. 5 illustrates exemplarily two individual finger elements 14-A of the edge structure 14-0 of the first electrode structure 14 and two individual finger elements 24-A of the edge structure 24-0 of the third electrode structure 24, as well as a finger element 16-A of the edge structure 16-0 of the second electrode structure 16 moving relative thereto. The arrangement of finger elements 14-A, 16-A, 24-A of the edge structures 14-0, 16-0, 24-0 shown in FIG. 5 can be continued periodically (at least in portions) to form the circumferential edge structures 14-0, 16-0, 24-0 of the first, second and third electrode structures 14, 16, 24.

With regard to the geometrical arrangement of the first and second electrode structures 14, 16, reference is made to the statements of FIGS. 1 and 2*a-b*, which are equally applicable here.

The above statements on the MEMS actuator 10 of FIG. 5 thus make it clear that the present concept can also be used to advantage in double-acting actuators in which the movable second electrode structure 16 opposes stationary electrode structures 14, 24 in both directions (i.e. 'above' and 'below' with respect to the z-direction). As a result, each electrode plane, i.e., the first and third electrode structures 14, 24, can be configured for only a portion of the address bits of the bit word of the control signal $V_S$, whereby the system, i.e., the MEMS actuator 10, can again exhibit greatly improved properties with limited structural resolution. For example, the most significant bit can be realized by many electrode fingers 24-A of the third electrode structure 24 above the movable electrode structure (of the actuator comb) 16, and the other bits of the bit word can be realized by correspondingly smaller finger groups, i.e., the partial electrode structures 14-1, . . . , 14-*n* of the first electrode structure 14 below the movable electrode structure 16. This can compensate for any additional manufacturing effort. In this case, the system, i.e., the MEMS actuator 10, can be configured such that the immersion depth $\Delta z_1$ and the overlap $\Delta z_3$ on both sides do not fall below the minimum values given above (for start and end positions) over the entire deflection range.

Figure 6:
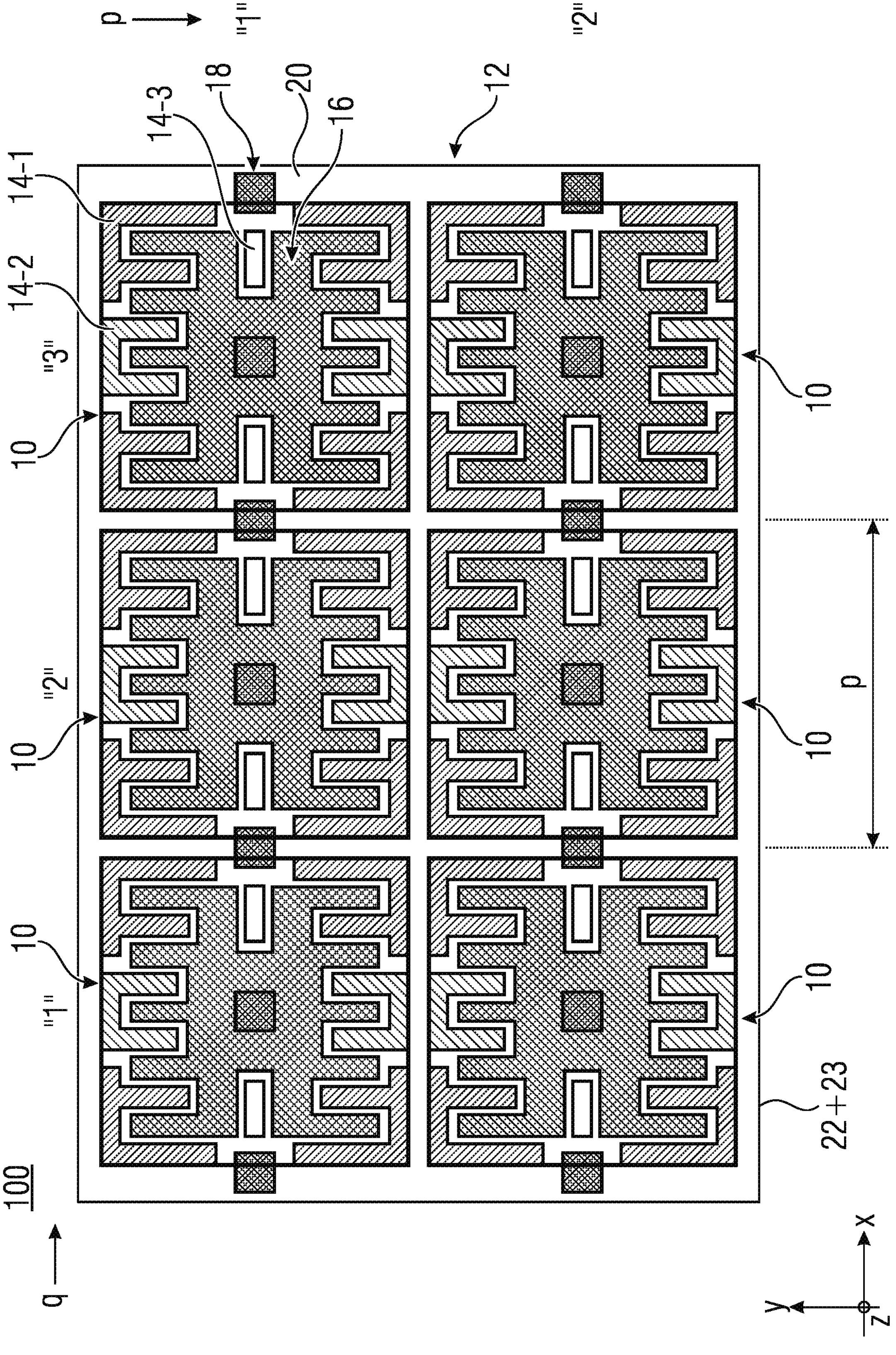
FIG. 6 is a schematic view of a regular array of MEMS actuators according to a further embodiment.
Figure 7:
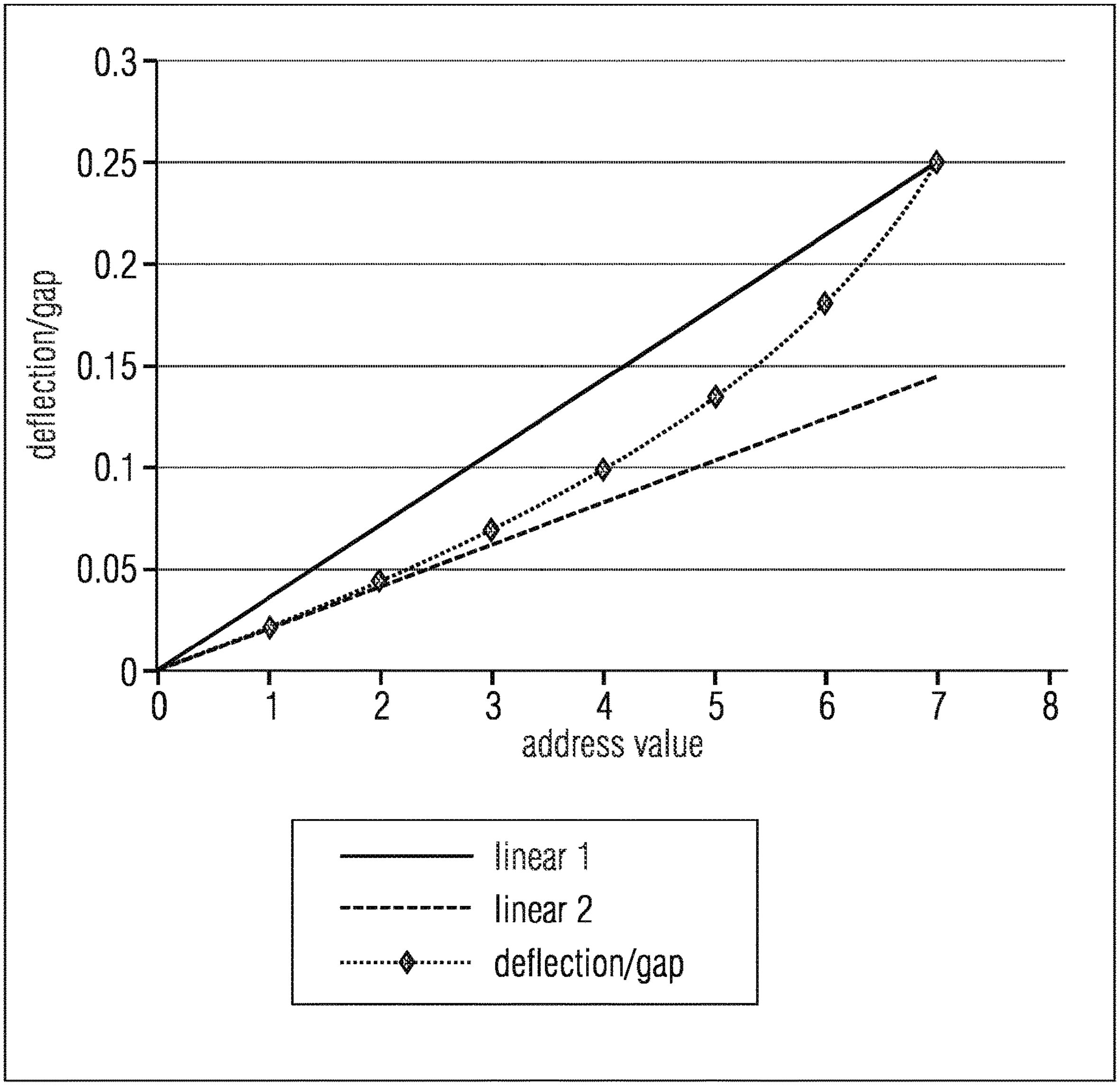
FIG. 7 is an exemplary simulated course of a non-linear graduated deflection of a digitally controlled eight-stage plate actuator according to conventional technology.

FIG. 6 shows a schematic top view of a regular array 100 of MEMS actuators according to a further embodiment. The MEMS array 100 of FIG. 6 comprises a plurality of symmetrically arranged MEMS actuators 10. It should be clear that the array arrangement shown can be implemented with any of the MEMS actuators 10 described above.

FIG. 6 shows exemplarily the MEMS actuator array 100 in a p×q array arrangement (p, q=positive integers), with p=2 rows and q=3 columns. However, the rows and columns can essentially be continued in any way to obtain the MEMS actuator array 100 with, for example, at least 10,000 MEMS actuators 10. For improved visibility of the electrode structures 14, 16, the spring elements 18-2 are omitted and the mirrors 20 are fully transparent and shown only by their (black) edge.

According to an embodiment, the MEMS actuator array 100 comprises a plurality of MEMS actuators 10 and further control means 22 for providing an individual control voltage $V_S$ between the first and second electrode structures 14, 16 of the respective MEMS actuators 10. The control means 22 is configured, for example, to selectively or individually provide each individual MEMS actuator 10 or different groups of the MEMS actuators 10 with a dedicated control voltage $V_S$.

The control means 22 can be further configured to provide a further individual control voltage $V'_S$ between the second and third electrode structures 14, 24 of the respective MEMS actuators 10.

According to an embodiment, the MEMS actuators 10 can include micromirror elements 20 that are each coupled to one of the second electrode structures 16, wherein the micromirror elements 20 are deflectable according to the deflection of the associated second electrode structure 16.

According to an embodiment, the second electrode structures 16 of the MEMS actuators 10 are deflectable to at least one intermediate position z based on the control voltage $V_S$. According to an embodiment, the control voltage $V_S$ and/or the further control voltage V's comprise a respective address voltage $V_B$, $V'_B$ for the MEMS actuators 10 and further a bias voltage $V_{BIAS}$, $V'_{BIAS}$ for the MEMS actuators 10, e.g. all actuators.

According to an embodiment, the MEMS actuator array 100 further comprises a CMOS backplane as the substrate 12, wherein the CMOS backplane comprises the control means 22 and further memory cells 23.

According to an embodiment, the MEMS actuator array 100 comprises at least 10,000 MEMS actuators 100 in a p×q arrangement, with p rows and q columns. According to an embodiment, the MEMS actuators 10 of the MEMS actuator array 100 can comprise a pitch P of less than or equal to 20 μm.

Although various embodiments and the wording in the description above relate to translatory MEMS actuators 10, e.g. with parallel deflecting micromirrors (lowering mirrors), the present inventive concept is also suitable for other MEMS elements, especially MEMS actuators 10 without mirrors.

Rotatory actuators can also be deflected in this way, wherein the deflection position z, which is well-defined for lowering mirrors, can then be approximately replaced by the maximum deflection of the edge structure 16-0 of the second electrode structure 16, i.e. the deflection at the fingertips 16-A (if present).

The present invention can be very well combined with springs according to patent [11] or even better application [12].

Some essential technical effects of the MEMS actuator 100 are summarized again below.

The described embodiments allow the realization of a "digitally" controlled micromechanical electrostatic actuator 10 with a large deflection range $\Delta z_2$ at small lateral dimensions, showing improved gradation of deflections compared to the plate actuators commonly used in this area and very low crosstalk between adjacent pixels.

The present inventive concept is also suitable for MEMS actuators 10 where more than two levels of deflection are obtained by addressing several electrodes or partial electrode structures 14-1, . . . , 14-*n* of the first electrode structure 14 (or partial electrode structures 14-1, . . . , 14-*n* and 24-1, . . . , 24-*n* of the first and third electrode structures 14 and 24) each independently with a binary or discrete voltage value. For example, the movable electrode structure 16 (on fixed electrical potential, bias voltage) can be opposed by four electrically separate, stationary partial electrode structures 14-1, . . . , 14-4, each connected to an SRAM memory cell of the address electronics 22. Each SRAM cell of address electronics 22 can assume only one of two (or more discrete) states at a time, and can provide the connected electrode with one of two (or more discrete) voltages $V_S$. If the four partial electrode structures 14-1, . . . , 14-4 generate electrostatic forces of different strengths due to different edge lengths (e.g., finger numbers, etc.), up to 16 stages in the analog deflection range of the MEMS actuator 10 can thus be controlled with a purely digital (or discrete) control in the example, i.e., without pull-in and without mechanical stops. In this case, due to the relatively good linearity of the characteristic curve according to embodiments, a significant improvement in the gradation of the deflection states can be achieved compared to a plate actuator with several electrodes.

The same could also be done with one stationary and several movable electrodes.

The present inventive concept is suitable for micromechanical actuators, in particular for phase-shifting SLMs (SLM=Spatial Light Modulator, an "array" for modulating light) with very small pixels (measured in terms of manufacturable mechanical structure sizes or the desired deflection). Such SLMs are of particular interest for digital holography, both for future holographic displays as well as for (more obvious) applications, such as universal laser tweezers, wavefront modeling and fast optical switches for fiber optic networks, where such SLMs enable simultaneous splitting as well as control of the direction, divergence, and intensity of laser beams. However, the usage in other devices for pattern generation or control of light distribution seems useful. Above that, multiple other applications in microactuator technology (even without micromirrors) as well as sensor technology are possible.

The following is a summary of embodiments of the MEMS actuator 10 and its structure, and the MEMS actuator array 100 having a plurality of MEMS actuators 10.

Additional embodiments and aspects of the invention are described below, which can be used individually or in combination with any of the features, functionalities and details described herein.

According to a first aspect, a MEMS actuator 10 comprises: a substrate 12, a first electrode structure 14 that is stationary with respect to the substrate 12, wherein the first electrode structure 14 comprises a plurality of partial electrode structures 14-1, . . . , 14-*n*, each of which comprises an edge structure 14-0 and can be electrically controlled separately, and a second electrode structure 16 with an edge structure 16-0, wherein the second electrode structure 16 is deflectably coupled to the substrate 12 by means of a spring structure 18 and is electrostatically deflectable by means of the first electrode structure 14 to move the edge structure 16-0 of the second electrode structure 16 into a discrete deflection position z, wherein the edge structures 14-0, 16-0 of the first and second electrode structures 14, 16 are configured to be opposite to each other with respect to a top view and the opposite portions are spaced-apart by a lateral distance $x_0$, and wherein the individual partial electrode structures 14-1, . . . , 14-*n* of the first electrode structure 14 are configured to apply a different, equally directed electrostatic force on the second electrode structure 16 based on an electric control voltage $V_S$ and to deflect the second electrode structure 16 into the discrete deflection position z.

According to a further aspect, the MEMS actuator further comprises: control means 22 for selectively controlling at least one subset of the partial electrode structures 14-1, . . . , 14-*n* of the first electrode structure 14 with a discrete voltage value of the control voltage $V_S$ to obtain, based on the selected subset of partial electrode structures, a resulting electrostatic force on the second electrode structure 16 with a corresponding change in the discrete deflection position of the edge structure 16-0 of the second electrode structure 16.

According to a further aspect, the electric control voltage $V_{Si}$ comprises a plurality of different discrete voltage values $V_S$, wherein based on the different discrete voltage values $V_{Si}$ of the electric control voltage $V_S$, the edge structure 16-0 of the second electrode structure 16 is deflectable into different discrete vertically spaced-apart deflection positions z.

According to a further aspect, the electric control voltage $V_S$ comprises two different discrete voltage values to provide digital control of the MEMS actuator 10.

According to a further aspect, the partial electrode structures 14-1, . . . , 14-*n* of the first electrode structure 14 differ with respect to their size and/or the respective lateral distance to the second electrode structure 16.

According to a further aspect, the first electrode structure 14 comprises "n" partial electrode structures 14-1, . . . , 14-*n* that apply an equally directed electrostatic force on the second electrode structure 16 that varies by a predetermined factor at a discrete voltage value of the electric control voltage $V_S$.

According to a further aspect, each of the "n" partial electrode structures 14-1, . . . , 14-*n* can be allocated to a different bit position of an n-bit word, wherein the respective partial electrode structure is allocated to a bit position of the n-bit word of higher significance the greater the electrostatic force of this partial electrode structure on the second electrode structure 16 during electrical excitation, and wherein the value of the respective bit of the n-bit word reflects the activation state of the allocated partial electrode structure.

According to a further aspect, the first and second electrode structures 14, 16 are spaced apart by a lateral distance in a plane parallel to the substrate 12, wherein the second electrode structure 16 comprises a first immersion depth $\Delta z_1$ in the minimum deflection position in the first electrode structure, wherein the first deflection position $\Delta z_1$ is between −0.25 times, 0 times, or 0.5 times the value and 1.5 times the value of the lateral distance $x_0$.

According to a ninth aspect, in a maximum deflection position $\Delta z_2$ of the second electrode structure 16 in the first electrode structure 14, a vertical overlap $\Delta z_3$ between the first and second electrode structures comprises at least 1 times, 1.5 times, or 2 times the value of the lateral distance $x_0$.

According to a further aspect, at least part of the edge structures 14-0 of the first electrode structure 14 comprises a finger or comb structure, and the edge structure 16-0 of the second electrode structure 16 comprises a further finger or comb structure.

According to a further aspect, the edge structures 14-0 of the first electrode structure 14 and the edge structure 16-0 of the second electrode structure 16 are configured to interdigitate at least in some areas.

According to a further aspect, the MEMS actuator 10 further comprises: a third electrode structure 24 that is stationary with respect to the substrate 12, wherein the second electrode structure 16 is disposed between the first and third electrode structures 14, 24 and being deflectable, wherein the second electrode structure 16 is electrostatically deflectable by means of the third electrode structure 24 to move the edge structure 16-0 of the second electrode structure 16 to a further discrete deflection position; wherein the first and third electrode structures 14, 24 are configured to apply an opposite electrostatic force on the second electrode structure 16 during electrical excitation.

According to a further aspect, the third electrode structure 24 comprises a plurality of partial electrode structures 24-1, . . . , 24-*m*, each of which comprises an edge structure 24- and can be electrically controlled separately, and the individual partial electrode structures 24-1, . . . , 24-*m* of the third electrode structure 24 are configured to apply a different, equally directed electrostatic force on the second electrode structure 16 during electrical excitation.

According to a further aspect, the second and third electrode structures 16, 24 are spaced apart by a lateral distance in a plane parallel to the substrate 12, wherein the second electrode structure 16 comprises a second immersion depth in the minimum deflection position of the third electrode structure 24, wherein the second immersion depth is between −0.25 times, 0 times, or 0.5 times the lateral distance and 1.5 times the lateral distance.

According to a further aspect, the second electrode structure 16 is deflectable in a translatory and/or rotatory manner with respect to the first electrode structure 14 or with respect to the first and third electrode structures 14, 24.

According to a further aspect, a MEMS actuator array 100 comprises: a plurality of MEMS actuators 10 and control means 22 for individually controlling the respective partial electrode structures 14-1, . . . , 14-*n* of the first electrode structures 14 and/or for individually controlling the respective third electrode structure 24-1, . . . , 24-*m* of the plurality of MEMS actuators 10, wherein the second electrode structures 16 of the MEMS actuators 10 are deflectable into at least one deflection position each between the minimum deflection position and the maximum deflection position in the first electrode structure 14 based on the control voltage $V_S$, and/or wherein the second electrode structures 16 of the MEMS actuators 10 can be deflected, based on the further control voltage $V_{Si}$, into at least one deflection position, each between the maximum deflection position in the first electrode structure 14 and the maximum deflection position in the third electrode structure 24.

According to a further aspect, the MEMS actuators 10 include micromirror elements 20 each coupled to one of the second electrode structures 16, wherein the micromirror elements 20 are deflectable according to the deflection of the second electrode structure 16.

According to a further aspect, the control voltage $V_S$ and/or the further control voltage $V_{Si}$ comprise a respective address voltage $V_B$ for the MEMS actuators 10 and further comprise a bias voltage $V_{BIAS}$ for the MEMS actuators 10.

According to a further aspect, the MEMS actuator array 100 comprises: a CMOS backplane as the substrate 12, the CMOS backplane comprising the control means 22 and further memory cells.

According to a further aspect, the MEMS actuator array 100 comprises at least 10,000 MEMS actuators 10.

According to a further aspect, the MEMS actuators 10 comprise a pitch of less than or equal to 20 μm.

Although some aspects of the present disclosure have been described as features in the context of an apparatus, it is obvious that such a description can also be considered as a description of respective method features. Although some aspects have been described as features in the context of a method, it is obvious that such a description can also be considered as a description of respective features of an apparatus or the functionality of an apparatus.

In the above detailed description, different features have partly been grouped together in examples to streamline the disclosure. This type of disclosure is not to be interpreted as the intent that the claimed examples comprise more features than explicitly stated in each claim. Rather, as the following claims will show, the subject matter can be in less than all features of an individual disclosed example. Consequently, the following claims are incorporated in the detailed description, wherein each claim can stand as its own separate example. While each claim can stand as its own separate example, it should be noted that although dependent claims in the claims relate to a specific combination with one or several other claims, other examples can also include a combination of dependent claims with the subject matter of each other dependent claim or a combination of each feature with the other dependent or independent claims. Such combinations are comprised, except it is stated that a specific combination is not intended. Further, it is intended that a combination of features of the claims with each of the other independent claims is also comprised, even when this claim is not directly dependent on the independent claim.

While this invention has been described in terms of several advantageous embodiments, there are alterations, permutations, and equivalents, which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCES

1. A. Gehner et al., "Micromirror arrays for wavefront correction", SPIE Vol. 4178, pp. 348-357 (2000).
2. Hubert Lakner et al.: "Design and Fabrication of Micromirror Arrays for UV-Lithography", Proc of SPIE Vol. 4561 (2001)
3. Christopher Aubuchon: 'Multi-Tilt Micromirror systems with concealed hinge structures', U.S. Pat. No. 6,900,922
4. James Hall et al.: ' Adapting Texas Instruments (TI) DLP® technology to demonstrate a phase spatial light modulator', Proc. of SPIE Vol. 10932 (2019)
5. Texas Instruments Incorporated, "DMD 101—Introduction to DMD technology", 2009

6. Peter Dürr et al.: 'Micro-actuator with extended analog deflection at low drive voltage', Proceedings of SPIE Vol. 6114 (2006)
7. Harald Schenk et al.: "A Novel Electrostatically Driven Torsional Actuator", Proc. 3rd Int. Conf. on Micro Opto Electro Mechanical Systems (1999)
8. L. Clark et al.: 'Vertical comb drive actuated deformable mirror device and method', U.S. Pat. No. 6,384,952
9. T. Sandner: 'Method of fabricating a micromechanical out of two-dimensional . . . ', U.S. Pat. No. 7,929,192
10. Veljko Milanovic et al.: 'Gimbal-less micro-electro-mechanical system . . . ', U.S. Pat. No. 7,295,726
11. Peter Dürr et al.: 'MEMS Aktuator, System mit einer Mehrzahl vom MEMS Aktuatoren und Verfahren . . . ', patent DE102015200626, patent application US2017297897AA
12. Peter Dürr et al.: 'MEMS mit einem beweglichen Strukturelement und MEMS-Array', German Patent Application 102018207783.5 (not yet published)

The invention claimed is:

1. MEMS actuator, comprising:

a substrate, a first electrode structure that is stationary with respect to the substrate, wherein the first electrode structure comprises a plurality of partial electrode structures, each of which comprises an edge structure, and wherein each of the plurality of partial electrode structures is configured to be separately electrically controllable, and a second electrode structure with an edge structure, wherein the second electrode structure is deflectably coupled to the substrate by means of a spring structure and electronically deflectable by means of the first electrode structure to move the edge structure of the second electrode structure into a plurality of discrete deflection positions, wherein the edge structures of the first and second electrode structures are configured to be opposite to each other with respect to a top view and the opposite portions are spaced apart by a lateral distance and wherein each of the individual partial electrode structures of the first electrode structure are configured to have a different degree of influence on a deflection based on an electric control voltage value by applying a different, equally directed electrostatic force on the second electrode structure based on the electric control voltage value, and to deflect the second electrode structure into the respective discrete deflection position.

2. MEMS actuator according to claim 1, further comprising:

a control for selectively controlling at least one subset of the partial electrode structures of the first electrode structure with a discrete voltage value of the control voltage to acquire, based on the selected subset of partial electrode structures, a resulting electrostatic force on the second electrode structure with a respective change of the discrete deflection position of the edge structure of the second electrode structure.

3. MEMS actuator according to claim 1, wherein the electric control voltage comprises a plurality of different discrete voltage values, wherein, based on the different discrete voltage values of the electric control voltage, the edge structure of the second electrode structure is deflectable in different discrete vertically spaced-apart deflection positions.

4. MEMS actuator according to claim 3, wherein the electric control voltage comprises two different discrete voltage values to provide digital control of the MEMS actuator.

5. MEMS actuator according to claim 1, wherein the partial electrode structures of the first electrode structure differ with respect to their size and/or the respective lateral distance to the second electrode structure.

6. MEMS actuator according to claim 1, wherein the first electrode structure comprises "n" partial electrode structures that apply, at a discrete voltage value of the electric control voltage, an equally directed electrostatic force differing by a predetermined factor to the second electrode structure.

7. MEMS actuator according to claim 6, wherein each of the "n" partial electrode structures are configured to be allocated to a different bit position of an n-bit word, wherein the respective partial electrode structure is allocated to a bit position of the bit word of higher significance the greater the electrostatic force of this partial electrode structure on the second electrode structure during electric excitation, and wherein the value of the respective bit of the bit word reflects the activation state of the allocated partial electrode structure.

8. MEMS actuator according to claim 1, wherein the first and second electrode structures are spaced apart by a lateral distance in a plane parallel to the substrate, wherein the second electrode structure comprises a first immersion depth in the minimum deflection position in the first electrode structure, wherein the first deflection position is between −0.25 times, 0 times or 0.5 times value and 1.5 times the value of the lateral distance.

9. MEMS actuator according to claim 1, wherein, in a maximum deflection position of the electrode structure in the first electrode structure, a vertical overlap between the first and second electrode structures comprises at least 1 times, 1.5 times or 2 times the value of the lateral distance.

10. MEMS actuator according to claim 1, wherein at least part of the edge structures of the first electrode structure comprise a finger or comb structure and wherein the edge structure of the second electrode structure comprises a further finger or comb structure.

11. MEMS actuator according to claim 1, wherein the edge structures of the first electrode structure and the edge structure of the second electrode structure are configured to interdigitate at least in some areas.

12. MEMS actuator according to claim 1, further comprising:

a third electrode structure that is stationary with respect to the substrate, wherein the second electrode structure is arranged between the first and third electrode structures and is deflectable, wherein the second electrode structure is electrostatically deflectable by means of the third electrode structure to move the edge structure of the second electrode structure into a further discrete deflection position;

wherein the first and third electrode structures are configured to apply, during electric excitation, an opposite electrostatic force on the second electrode structure.

13. MEMS actuator according to claim 12, wherein the third electrode structure comprises a plurality of partial electrode structures, each of which comprises an edge structure, wherein each of the partial electrode structures is configured to be electrically controlled separately, and wherein the individual partial electrode structures of the third electrode structure are configured to apply, during electric excitation, a different, equally directed electrostatic force on the second electrode structure.

14. MEMS actuator according to claim 12, wherein the second and third electrode structures are spaced apart by a lateral distance in a plane parallel to the substrate, wherein the second electrode structure comprises a second immersion depth in the minimum deflection position in the third electrode structure, wherein the second immersion depth is between −0.25 times, 0 times or 0.5 times the value and 1.5 times the value of the lateral distance.

15. MEMS actuator according to claim 1, further comprising a third electrode structure, wherein the second electrode structure is configured to be deflected in a translatory and/or rotatory manner with respect to the first electrode structure or with respect to the first and third electrode structures.

16. MEMS actuator array, comprising:

a plurality of MEMS actuators according to claim 1 and a control for individually controlling the respective partial electrode structures of the first electrode structures and/or for individually controlling the respective third electrode structure of the plurality of MEMS actuators, wherein the second electrode structures of the MEMS actuators are configured to be deflectable into at least one deflection position each between the minimum deflection position and the maximum deflection position in the first electrode structure, based on the control voltage, and/or wherein the second electrode structures of the MEMS actuators are configured to be deflectable into at least one deflection position each between the maximum deflection position in the first electrode structure and the maximum deflection position in the third electrode structure, based on the further control voltage.

17. MEMS actuator array according to claim 16, wherein the MEMS actuators comprise micromirror elements that are each coupled to one of the second electrode structures, wherein the micromirror elements are deflectable according to the deflection of the second electrode structure.

18. MEMS actuator array according to claim 16, wherein the control voltage and/or the further control voltage comprise a respective address voltage for the MEMS actuators and further a bias voltage for the MEMS actuators.

19. MEMS actuator array according to claim 16, comprising:

a CMOS backplane as the substrate, wherein the CMOS backplane comprises the control and further memory cells.

20. MEMS actuator array according to claim 16, wherein the MEMS actuator array comprises at least 10,000 MEMS actuators.

21. MEMS actuator array according to claim 16, wherein the MEMS actuators comprise a pitch of less than or equal to 20 μm.

* * * * *